United States Patent [19]

Hayashi et al.

[11] Patent Number: 5,166,521
[45] Date of Patent: Nov. 24, 1992

[54] ION-SCATTERING SPECTROMETER

[75] Inventors: Shigeki Hayashi; Sumio Kumashiro, both of Kyoto; Masakazu Aono, Tokyo; Mitsuhiro Katayama, Wako, all of Japan

[73] Assignees: Shimadzu Corporation, Kyoto; Rikagaku Kenkyuusyo, Saitama, both of Japan

[21] Appl. No.: 795,144

[22] Filed: Nov. 20, 1991

[30] Foreign Application Priority Data

Nov. 30, 1990 [JP] Japan ................... 2-338661

[51] Int. Cl.⁵ .................. H01J 37/252; H01J 49/44
[52] U.S. Cl. ................................ 250/309; 250/287
[58] Field of Search ............... 250/309, 287, 305

[56] References Cited

U.S. PATENT DOCUMENTS 5,068,535 11/1991 Rabalais ............... 250/309
5,097,125 3/1992 Gruen et al. ........... 250/305

FOREIGN PATENT DOCUMENTS

63-102150 5/1988 Japan.
63-102151 5/1988 Japan.

Primary Examiner—Jack I. Berman
Assistant Examiner—Kiet T. Nguyen
Attorney, Agent, or Firm—Nikaido, Marmelstein, Murray & Oram

[57] ABSTRACT

An ion source, a first control electrode for controlling an ion beam emitted by the ion source, a detector for detecting scattered particles, and a second control electrode for controlling the ion beam, which is directed from the ion source toward a sample, as well as the scattered particles, are arranged on the same axis along with the sample. The ion beam directed from the ion source toward the sample, and the scattered particles, which are scattered from the sample and are directed toward the detector, are caused to converge. By using an Einzel-type lens as the second control electrode, charged particles and neutral particles constituting the scattered particles are provided with a difference in speed. The detector possesses an anode plate which is divided into the form of concentric, circular plates or concentric arc-shaped plates, and each divided anode plate provides a detection output which contains information relating to a distribution of the scattering angles of the scattered ions.

13 Claims, 6 Drawing Sheets

ION-SCATTERING SPECTROMETER

BACKGROUND OF THE INVENTION

This invention relates to an impact collision, ion-scattering spectrometer. More specifically, the invention relates to an apparatus in which a sample is irradiated with an ion beam, whereby particles are caused to scatter from the sample, and the energy of those particles which scatter in an axial direction the same as that of the irradiating ion beam on the incident side of the beam is analyzed.

In many cases a time of flight spectrometer is used as means for analyzing energy in an impact collision, ion-scattering spectrometer. A time-of-flight spectrometer performs energy analysis based upon differences in time required for particles, which are scattered simultaneously from a sample, to reach a detector. The characterizing feature of a spectrometer of this type is that energy analysis is capable of being performed without taking account of whether the particles carry an electric charge.

The particles caused to scatter when a sample is irradiated with ions are of two types. One type is scattered while carrying an electric charge. The other type is scattered as a neutral particle since its electric charge is acquired by the sample. The aforementioned characterizing feature of the time-of-flight spectrometer derives from the fact that all of the scattered particles consisting of these two types are subjected to energy analysis.

Of the two types of particles mentioned, many of those that are scattered while possessing electric charge are caused to scatter by the atoms arrayed on the surface of the sample. On the other hand, the neutralized particles penetrate into the interior of the sample from its surface and are scattered after interacting with the atoms of the sample. In other words, the two types of particles possess different information regarding the sample.

Accordingly, the impact collision ion-scattering spectrometer apparatus which uses the time-of-flight spectrometer discards information specific to these two types of particles and obtains only that information common to both types of particles.

In terms of its structure, the features of the time-of-flight spectrometer are as follows:

The time-of-flight spectrometer includes an ion source and a detector arranged in a straight line on their common optic axis, with the detector being situated between the sample and the ion source. Accordingly, in order to perform energy analysis based upon time of flight, a considerable particle flight distance is required. As a result, the distance from the ion source to the sample surface is great and therefore it is difficult to make the beam converge on the sample surface. Consequently, the apparatus is not suited to micro-structural analysis of the sample surface and the only information acquired is average analytical information of certain areas.

Nevertheless, since the above-described apparatus possesses a linearly arranged structure, an advantage is that little space is required for installation.

Accordingly, regardless of the aforementioned drawback, namely the fact that the impact collision ion-scattering scattering spectrometer apparatus using the time-of-flight spectrometer is not suitable for micro-structural analysis of a sample surface, the apparatus is in wide use because the energy of all scattered particles is analyzed and because of the above mentioned advantage of the small installation space required.

The present applicant has disclosed, in the specification of Japanese Patent Application Laid-Open No. 63-102151, filed for patent in Japan on Oct. 17, 1986 and laid open on May 7, 1988, an impact collision ion-scattering spectrometer apparatus using the above-described time-of-flight spectrometer. In accordance with the disclosed apparatus, only ions scattered over a very wide scattering angle approaching 180° are detected, and the scattered ions are not utilized sufficiently. In addition, particles cannot be distinguished by the absence or presence of electric charge, and therefore the analytical information indicative of the sample surface cannot be analyzed sufficiently. Furthermore, difficulties are encountered in converging the ion beam on the sample surface, the apparatus is not suited to micro-structural analysis of the sample surface, and the only information acquired is average analytical information of certain areas.

Similarly, the present applicant has disclosed, in the specification of Japanese Patent Application Laid-Open No. 63-102150, filed for patent in Japan on Oct. 17, 1986 and laid open on May 7, 1988, an impact collision ion-scattering spectrometer apparatus in which the ion beam is deflected and caused to perform scanning in two dimensions on the planar surface of a sample so as to analyze the composition of the sample surface. In this apparatus also, the scattered ions are not utilized sufficiently, just as in the example of the prior art described above. In addition, particles cannot be distinguished by the absence or presence of electric charge, and therefore the analytical information indicative of the sample surface cannot be analyzed sufficiently. Furthermore, difficulties are encountered in converging the ion beam on the sample surface, the apparatus is not suited to micro-structural analysis of the sample surface, and the only information acquired is average analytical information of certain areas.

SUMMARY OF THE INVENTION

An object of the present invention is to provide an ion scattering spectroscope in which the ion beam can be made to converge on the surface of a sample to make possible micro-structural analysis of the sample surface, ions and neutral particles are measured while being distinguished from each other to make possible detailed analysis of the sample surface, and scattered ions in a wide solid angle are acquired to raise ion detection efficiency and make possible measurement of the distribution of the scattering angles of scattered ions.

According to the present invention, the foregoing object is attained by providing an ion-scattering spectroscope apparatus which includes an ion source, a first control electrode for controlling an ion beam emitted by the ion source, a detector for detecting scattered particles, and a second control electrode for controlling the ion beam, which is directed from the ion source toward a sample, as well as the scattered particles, these components being arranged on the same axis along with the sample. The ion beam directed from the ion source toward the sample is caused to converge to irradiate a minute portion of the sample, with the second control electrode serving as an Einzel-type lens. Particles scattered from the sample and directed toward the detector are caused to converge, and scattered ions over a wide solid angle are acquired to raise the ion detection efficiency. Owing to use of the Einzel-type lens of the second control electrode, the charged particles and neutral particles among the scattered particles are provided with a difference in speed to make it possible to distinguish between and measure these two types of particles. Further, the detector possesses an anode plate which is divided into the form of concentric, circular plates or concentric arc-shaped plates the detection output of each of which is subjected to signal processing, thereby making it possible to measure a distribution of scattering angles of the scattered ions.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1:
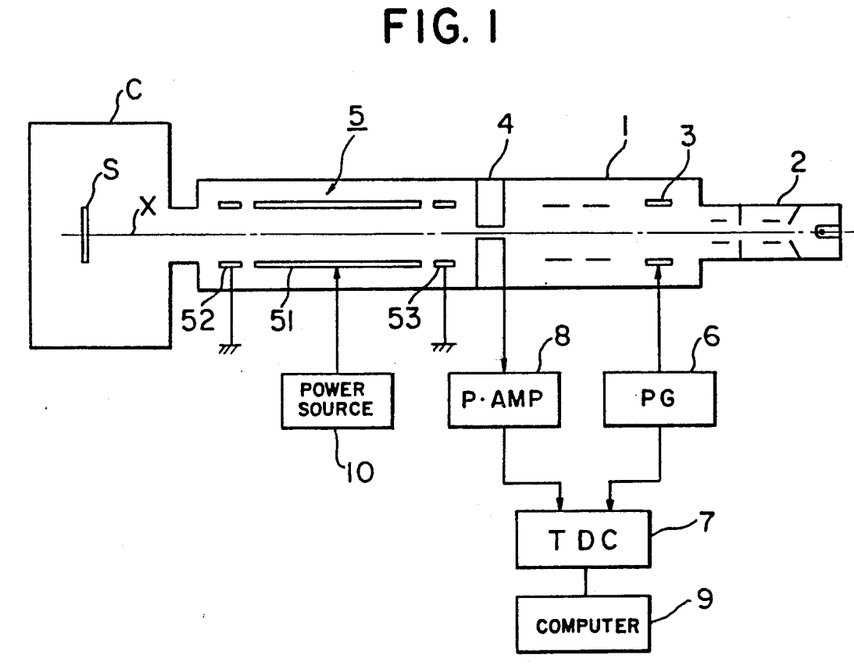
FIG. 1 is a schematic view showing an ion-scattering spectroscope apparatus according to the present invention.

FIG. 1 is a schematic view showing a first embodiment of an ion-scattering spectroscope apparatus according to the present invention.

Figure 2:
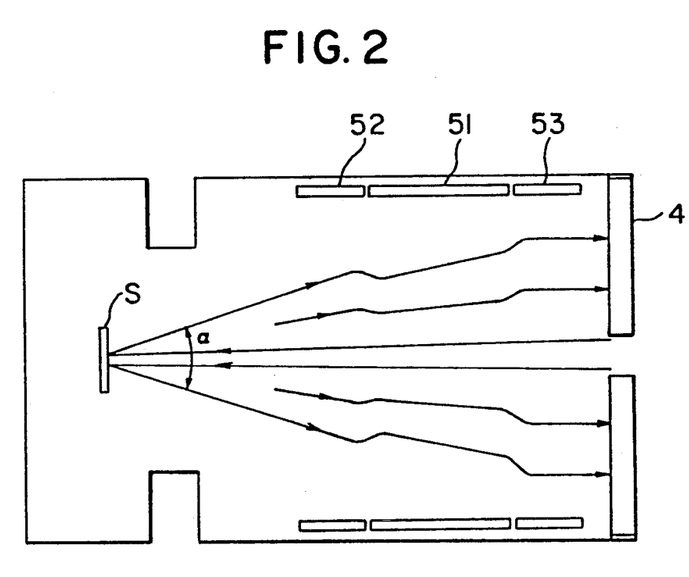
FIG. 2 is a schematic view showing ion tracks.

As shown in FIG. 1, the apparatus has an external case 1 of a linear configuration a first end of which is provided with an ion source 2 on an axis X within the case. A chamber C in which a sample S is disposed in arranged in the case on the axis X at a second end thereof. The ion source 2 emits an ion beam directed toward the sample S. A chopping electrode 3, a detector 4 and an accelerating electrode 5 are arranged within the external case 1 in the order mentioned between the ion source 2 and the sample S. These components also are disposed on the same axis X. A pulse generator 6 is connected to the chopping electrode 3. A hole is formed in the central portion of the detector 4 so that the ion beam emitted by the ion source 2 may be introduced to the sample S through the hole. The output of the detector 4 enters a preamplifier 8. The accelerating electrode 5 comprises three cylindrical electrodes 51, 52, 53 coaxially disposed, as shown in FIG. 2. The centrally located electrode 51 is supplied with an ion accelerating voltage by a power source 10. The electrodes 52, 53 on either side of electrode 51 are set to the same ground potential as the sample S. The entire accelerating electrode 5 constructs an Einzel-type lens.

Figure 3:
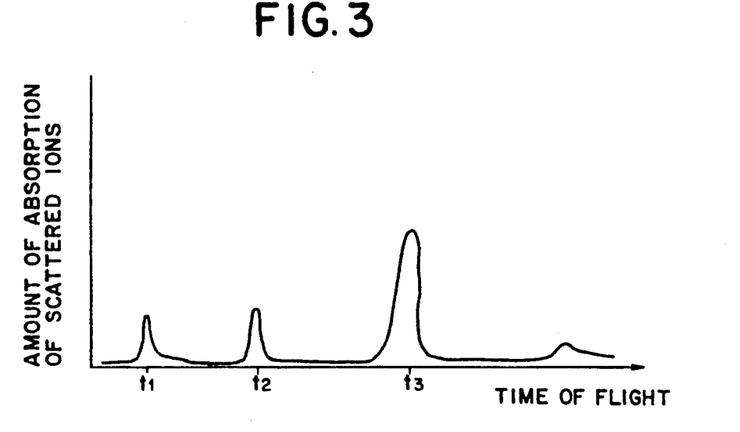
FIG. 3 is a schematic view showing the time-of-flight spectrum of scattered ions obtained according to the present invention.

The ion source emits the ion beam at all times, and the impinging of the ion beam on the sample S is controlled by the chopping electrode 3. The pulse generator 6 supplies the chopping electrode 3 with a voltage for deflecting the ion beam. When a chopping pulse is applied, the deflecting voltage temporarily becomes zero. The ion beam impinges upon the sample S during the time that the deflecting voltage is zero. By repeating this process, the ion beam impinges upon the sample S periodically for very short periods of time. The strength of the ion beam and the irradiating time are set in such a manner that approximately one particle will be detected in one irradiating time period. Next, the ion beam passes through the hole formed in the central portion of the detector 4, and then through the accelerating electrode 5, where the ion beam is converged before impinging upon the sample S. When the ion beam impinges upon the sample S, particles are caused to scatter from the sample. Among the particles which scatter from the sample S, particles scattered in a direction opposite that of the incident ion beam pass through the accelerating electrode 5 again in the opposite direction and then impinge upon the detector 4. When these particles impinge upon the detector 4, the latter produces a detection signal which enters the amplifier 8, where the signal is amplified. The pulse generator 6 and amplifier 8 are connected to a time-to-digital converter (TDC) 7 for converting time to digital data. The converter 7 starts counting in response to an output pulse from the pulse generator 6 and stops counting in response to an output signal from the detector 4. Thus, timekeeping is performed based upon the count. The converter 7 is connected to a computer 9, which generates a histogram of the count recorded by converter 7. The histogram is an energy spectrum of the scattered particles from the sample. FIG. 3 is a schematic view showing the time of-.flight spectrum of scattered ions obtained according to the present invention.

When the ion beam from the ion source 2 is directed toward the sample S, the ion beam is accelerated between the electrodes 53 and 51, advances at a uniform speed along the interval of electrode 51, and is decelerated between the electrodes 51 and 52. Overall, the ion beam is accelerated by the accelerating electrode 5. At this time the electrode beam undergoes a converging action. Conversely, when the ion beam is directed from the sample S toward the ion source 2, the beam is accelerated between the electrodes 52 and 51, advances at a uniform speed along the interval of electrode 51, and is decelerated between the electrodes 51 and 53. Overall, the ion beam is accelerated by the accelerating electrode 5. At this time the ion beam undergoes a converging action. On the other hand, the action of the accelerating electrode 5 on neutral particles devoid of electric charge differs from the action on the ion beam. Since neutral particles are not influenced by an electric field, they are neither accelerated, decelerated nor caused to converge during their passage through the accelerating electrode 5. Accordingly, if the ions and neutral particles are emitted from the sample S at the same speed, the ions will pass through the accelerating electrode 5 at a speed higher than that of the neutral particles and they will arrive at the detector 4 sooner than the neutral particles. As a result, the energy spectrum of the ions and the energy spectrum of the neutral particles differ, and the two energy spectrums can be distinguished from each other. More specifically, in comparison with the spectrum of the neutral particles, the ion spectrum has an apparent shift toward the higher energy side. Though the amount of this shift varies depending upon the voltage applied to the electrode 51, there is no change in the shape of the spectrum itself.

Since the accelerating electrode 5 is an Einzel-type lens, the speeds of the ions and neutral particles in the detector 4 are identical.

Furthermore, in a case where a voltage is not applied to the accelerating electrode, the structure thereof is no different from that of the conventional ion-scattering spectroscope apparatus, and the distance from the sample S to the detector 4 serves as a speed classifying distance in which the scattered particles are classified by the difference in speed.

The aforementioned effect in which the scattered particles are measured upon being classified as ions or neutral particles by means of their respective energy spectrums is obtained by the electrode 51 of the accelerating electrode 5; the electrodes 52, 53 play no part.

The operation of the electrodes 52, 53 constituting the accelerating electrode 5 of the Einzel-type lens will now be described with reference to FIG. 2.

FIG. 2 schematically illustrates the tracks of charged particles which pass through the arrangement of electrodes 51, 52, 53. The tracks indicated by the leftwardly directed arrows are the ion tracks of ion beams emitted toward the sample S by the ion source 2, and the tracks indicated by the rightwardly directed arrows are the ion tracks of ion beams emitted toward the ion source 2 by the sample S. Thus, the ion beams which irradiate the sample S converge toward the sample S. Among the ion beams which diverge from the sample S, those which scatter from the sample S over a solid angle $\alpha$ centered on the optic axis converge and impinge upon the detector 4 substantially as a parallel flux. Owing to this converging action, it is possible to acquire scattered ions over a wide solid angle, thereby raising ion detection efficiency.

Accordingly, ions and neutral particles can be measured while being distinguished from each other by providing the accelerating electrode, and the ion beams can be made to converge toward the sample surface by arranging the accelerating electrode in the form of an Einzel-type lens, thus making possible the analysis of minute areas on the sample surface as well as the acquisition of scattered ions over a wide solid angle. This makes it possible improve ion detection efficiency and to measure the distribution of scattering angles of the scattered ions.

Figure 4:
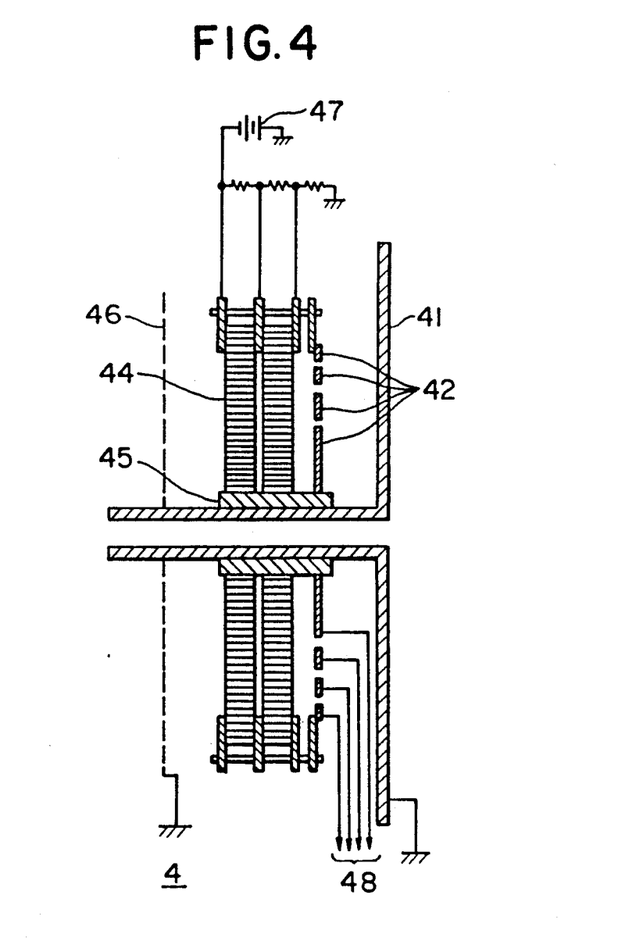
FIG. 4 is a diagram illustrating a detector.

An embodiment of the detector 4 will be described with reference to FIG. 4.

By way of example, the detector 4 used can be one which employs a microchannel plate 44. The microchannel plate 44 comprises a number of slender glass tubes clustered together in the form of a disk, each glass tube having its inner wall coated with a secondary-emission material. A high voltage from a high-voltage power supply 47 is applied across the microchannel plate 44. A collimator 41 for introducing the incident ions inserted, along with a spacer 45, into the interior of the detector along its central axis. The electric field produced by the aforesaid high voltage is grounded by the collimator 41 so as not to act upon the ions passing through the collimator 41, and the latter is insulated from the microchannel plate 44 by the spacer 45, which consists of an insulator. A grounded, mesh-shaped grid 46 is provided on the front side of the microchannel plate 44 to form a shield against the high-voltage field so that the incident ions which have exited the collimator 41 will advance through the fieldless space without their trajectories being changed by the high-voltage field. When the scattered ions arrive at the microchannel plate 44 upon having passed through the grid 46, the ions are accelerated by the electric field resulting from the high-voltage applied across the microchannel plate 44. The accelerated ions impact against the microchannel plate 44. Secondary electrons emitted by the microchannel plate 44 are accelerated and doubled in velocity by the high-voltage field, and a detection signal is extracted by an anode plate 42. In a first embodiment of the anode plate 42, in which the anode plate 42 has a size approximately the same as that of the microchannel 44, the ions scattered from the sample S at their respective scattering angles are detected irrespective of these scattering angles. As a result, information regarding the scattering angles cannot be extracted.

Figure 5:
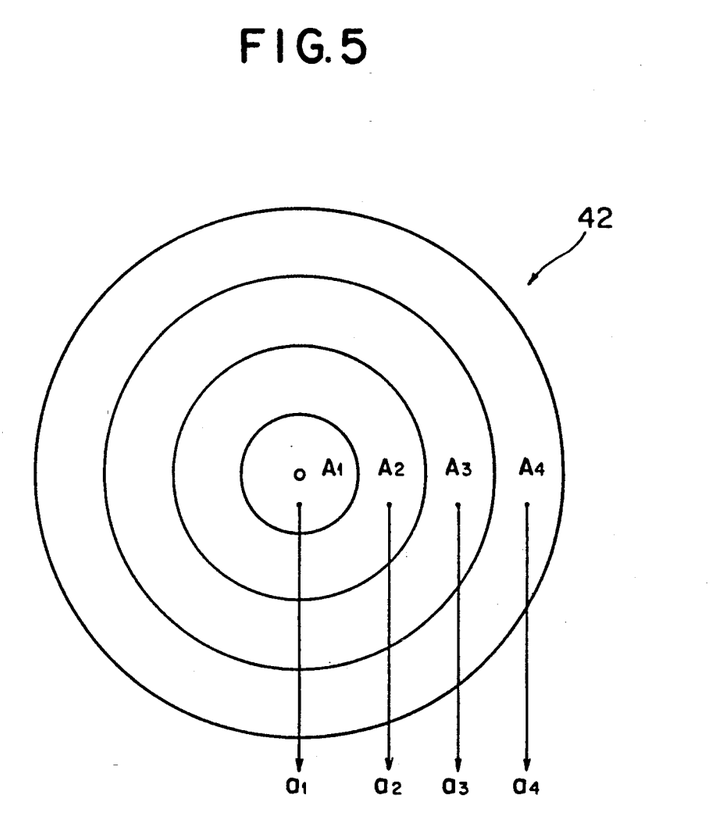
FIG. 5 is a diagram illustrating an embodiment of an anode of the detector.

A second embodiment of the anode plate 42 will be described with reference to FIG. 5. In this embodiment, the anode plate 42 is split into concentric plates $A_1$, $A_2$, $A_3$, $A_4$.

Figure 7:
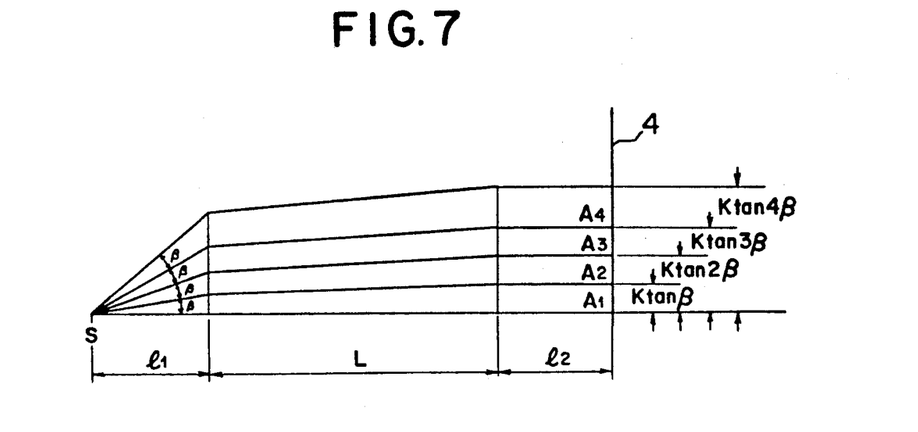
FIG. 7 is a diagram illustrating the scattering angles of a scattered particles as well as the dispersion of arrival times.

Signals $a_1$, $a_2$, $a_3$, $a_4$ are extracted from respective ones of the split anode plates $A_1$, $A_2$, $A_3$, $A_4$, and these signals enter a signal processing circuit, described below. The relationship between the diameters of the anode plates $A_1$, $A_2$, $A_3$, $A_4$ and scattering angle will be described with reference to FIG. 7. In FIG. 7, $l_1$ represents the distance from the sample S to the accelerating electrode, L the length of the accelerating electrode itself, and $l_2$ the distance from the accelerating electrode to the detector 4. When ions scatter from the sample S at scattering angles $\beta$, $2\beta$, $3\beta$ and $4\beta$, the ion beams arrive at the detector 4 at positions Ktan$\beta$, Ktan2$\beta$, Ktan3$\beta$, Ktan4$\beta$, respectively, relative to the central axis, where K is a constant decided by L, $l_2$ and the convergence constant of the accelerating electrode. Accordingly, the diameters of the anode plates $A_1$, $A_2$, $A_3$, $A_4$ are proportional to tan$\beta$, tan2$\beta$, tan3$\beta$, tan4$\beta$. By adopting these diameters for the anode plates, the values detected by the anode plates $A_1$, $A_2$, $A_3$, $A_4$ will be proportional to the scattering angles $\beta$, $2\beta$, $3\beta$, $4\beta$.

Figure 6:
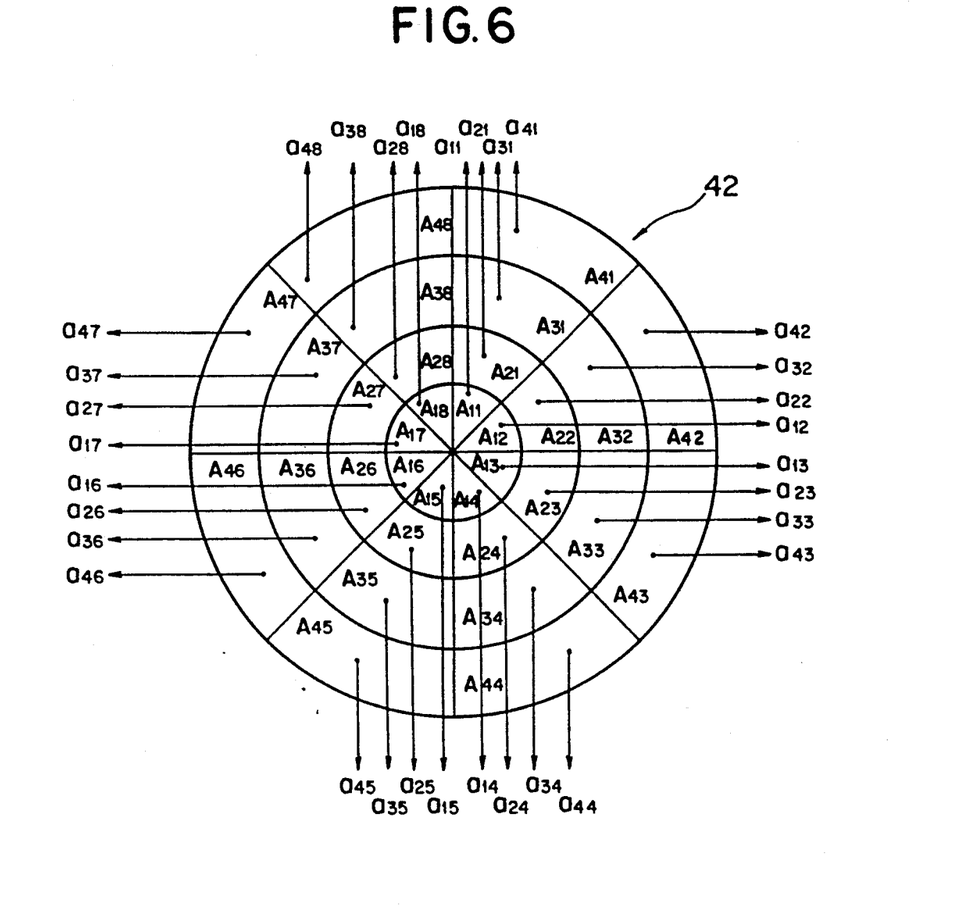
FIG. 6 is a diagram illustrating another embodiment of an anode of the detector.

A third embodiment of the anode plate 42 will be described with reference to FIG. 6. In this embodiment, the anode plate 42 is split into concentric, arc-shaped plates $A_{11}$–$A_{18}$, $A_{21}$–$A_{28}$, $A_{31}$–$A_{38}$, $A_{41}$–$A_{48}$ arranged in radiating fashion. Signals $a_{11}$–$a_{18}$, $a_{21}$–$a_{28}$, $a_{31}$–$a_{38}$, $a_{41}$–$a_{48}$ are extracted from respective ones of the split anode plates $A_{11}$–$A_{18}$, $A_{21}$–$A_{28}$, $A_{31}$–$A_{38}$, $A_{41}$–$A_{48}$, and these signals enter a signal processing circuit, described below. As in the second embodiment, the diameters of the concentrically arranged anode plates are formed to be proportional to tan$\beta$, tan2$\beta$, tan3$\beta$, tan4$\beta$, and the angles of the arc shaped plates are equal. By adopting these diameters and angles for the anode plates, the values detected by the anode plates $A_{11}$–$A_{18}$, $A_{21}$–$A_{28}$, $A_{31}$–$A_{38}$, $A_{41}$–$A_{48}$ will be proportional to the scattering angles $\beta$, $2\beta$, $3\beta$, $4\beta$.

The diameters of the anode plates along the axes of division and the angles in the circumferential direction can be set depending upon the characteristics of the scattering angles, the angle of placement of the sample relative to the axis of ion incidence, the characteristics of the accelerating electrode, and the positional relationship among the sample, electrode and detector.

Figure 8:
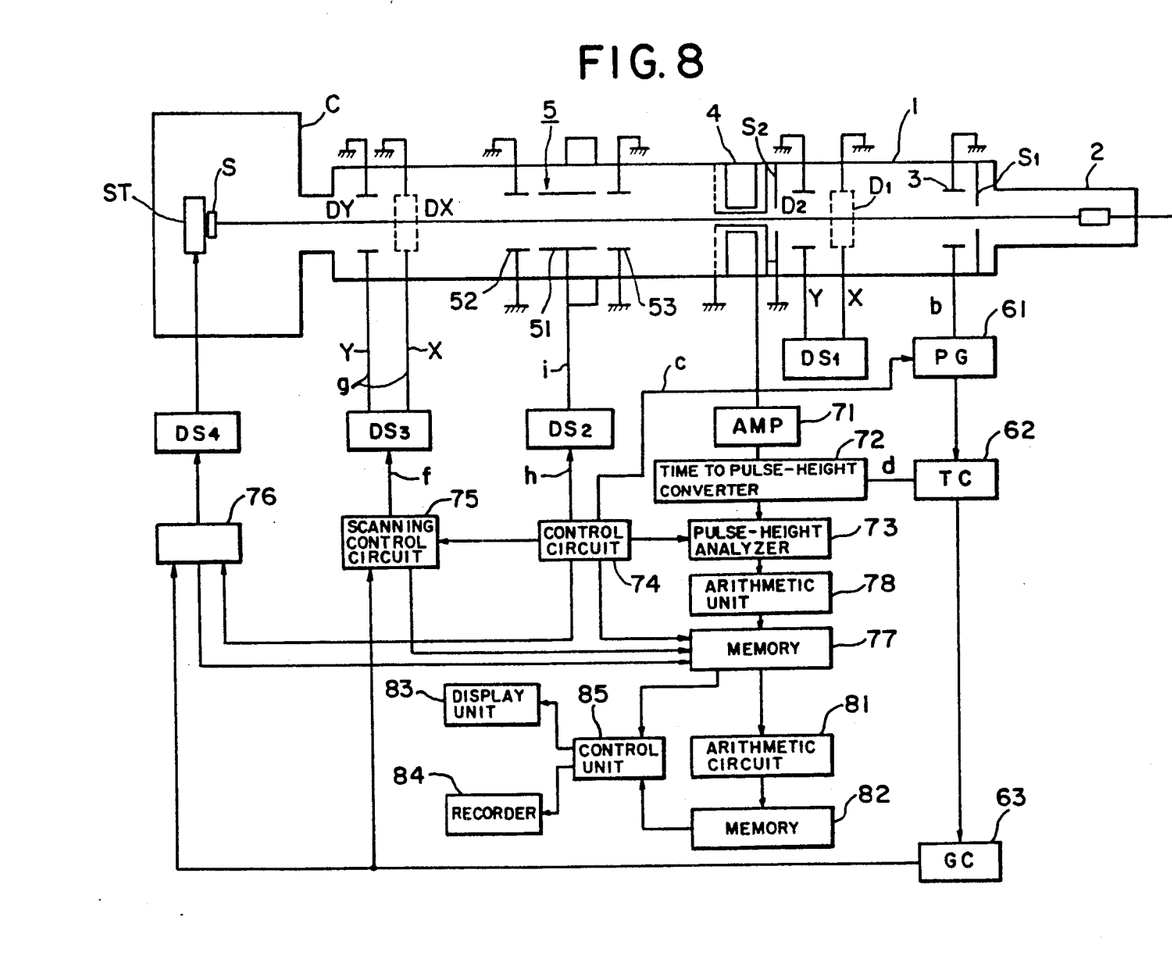
FIG. 8 is a schematic view showing another embodiment of an ion-scattering spectroscope apparatus according to the present invention.
Figure 9:
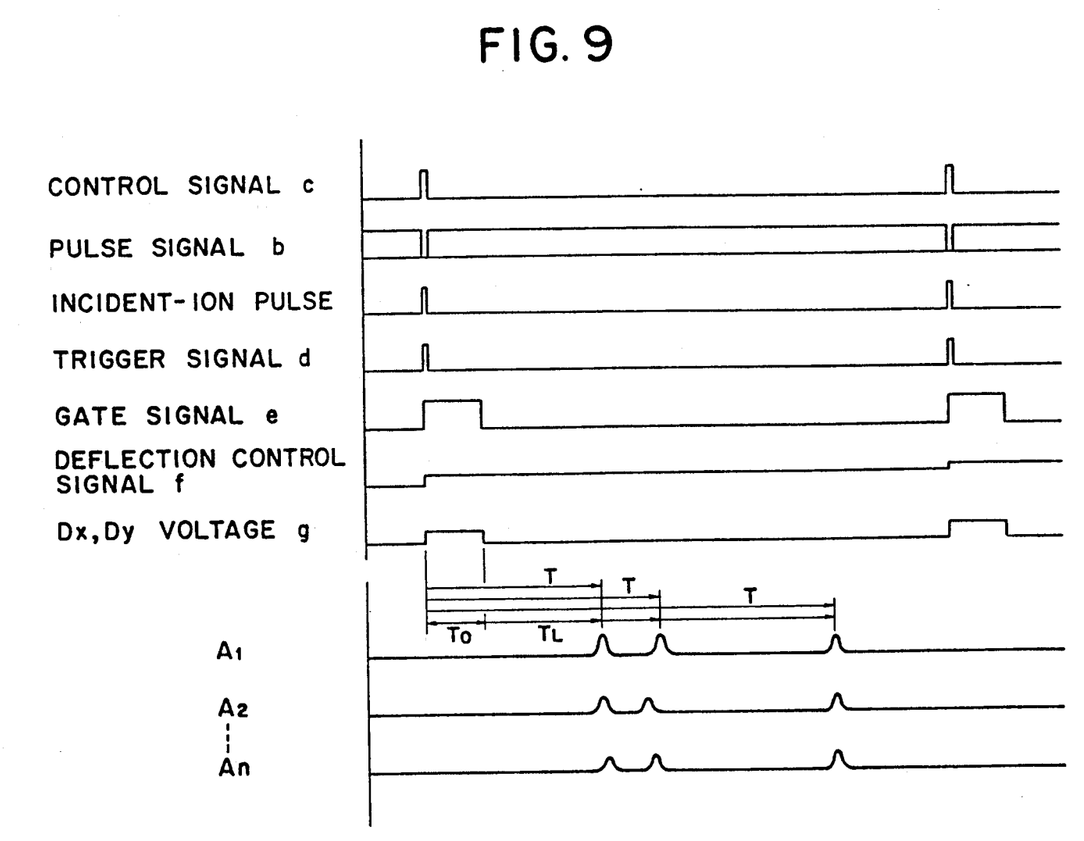
FIG. 9 is a timing chart for describing the operation of the embodiment shown in FIG. 8.

FIG. 8 is a schematic view showing a second embodiment of an ion-scattering spectroscope apparatus according to the present invention.

In the second embodiment, the ion-scattering spectroscope apparatus of the first embodiment is additionally provided with deflectors $D_1$, $D_2$ between the chopping electrode 3 and detector 4, beam deflectors $D_x$, $D_y$ between the accelerating electrode 5 and the sample S, a sample drive unit ST for changing the polar-coordinate angle and azimuth angle of the sample S relative to the incident ion beam, and a device for driving and controlling these additional components. A power supply $DS_1$ for the deflectors $D_1$, $D_2$ is connected thereto. A pulse generator 61 is connected to the chopping electrode 3 and generates a pulse signal in response to which the ion beam impinges upon the sample S. A trigger circuit 62 and a gate circuit 63 are connected to the pulse generator 61. The gate circuit 63 is further connected to a scanning control circuit 75 and a control circuit 76 for controlling the sample drive unit ST. The scanning control circuit 75 sends a control signal to a beam-scanning power supply $DS_3$ to drive the beam deflectors $D_x$, $D_y$. The control circuit 76 for controlling the sample drive unit ST sends a control signal to a sample driving power supply $DS_4$ to drive the sample drive unit ST. An electrode power supply $DS_2$ is connected to the accelerating electrode 5, and the voltage applied from this power supply is controlled by a control circuit 74. The control circuit 74 is connected also to the pulse generator 61, scanning control circuit 75 and sample drive-unit control circuit 76. The output signal lines $a_1$, $a_2$, $a_3$, $a_4$ of the detector shown in FIG. 5, or the output signal lines $a_{11}$, $a_{12}$–$a_{18}$, $a_{21}$–$a_{28}$, $a_{31}$–$a_{38}$, $a_{41}$–$a_{48}$ of the detector shown in FIG. 6 enter a preamplifier 71. The output of the amplifier 71 is connected to the input of a time-to-pulse-height converter 72, whose output is connected to a pulse-height analyzer 73, the output of which is connected to a memory 77. A trigger circuit 62 produces a start signal which is applied to the time-to-pulse-height converter 72, whereby the latter starts a counting operation. The pulse-height analyzer 73 and the memory 77 are controlled by a control signal from the control circuit 74. Data relating to scattered ion-beam information from the pulse-height analyzer 73 is applied to the memory 77, as well as data relating to scanning information from the scanning control circuit 75 and sample drive unit control circuit 76, and data relating to sample position information.

A display unit 83 and a recorder 84 are connected to the memory 77. Also connected to the memory 77 is an arithmetic circuit 81 which delivers its processed data to a memory 82. The data in the memory 82 is fed into the display unit 83 and recorder 84.

The operation of the second embodiment will now be described.

The control unit 74 applies a position control signal to the sample drive-unit control circuit 76, thereby setting the position of the sample S relative to the incident ion beam. Setting the position of the sample S involves setting its polar-coordinate angle and azimuth angle relative to the incident ion beam, as well as its position in the X and Y directions. The sample drive-unit control circuit 76 applies the position control signal to the sample driving power supply $DS_4$, thereby driving the sample drive unit ST. It is possible for the set position of the sample drive unit ST to be detected by a position sensor, which can then apply feedback to the sample drive-unit control circuit 76.

The ion beam from the ion source 2 is emitted at all times, by the irradiation of the sample S is performed by controlling the chopping electrode 3. The control unit 74 applies a control signal c to the pulse generator 61, and the pulse generator 61 applies a pulse signal b to the chopping electrode 3. A voltage is applied to the chopping electrode 3 when measurement is not being performed. As a result, the ion beam is deflected and does not irradiate the sample S. When the pulse signal b is applied to the chopping electrode 3, the voltage applied to the chopping electrode 3 becomes zero temporarily. At such time the ion beam is not deflected and the sample S is irradiated with a pulse of incident ions. Measurement is performed one time by the control signal c. The next measurement is performed in response to the next control signal c.

After passing the chopping electrode 3, the ion beam passes the deflectors D1, D2, detector 4, accelerating electrode 5 and beam deflectors $D_x$, $D_y$ and then irradiates the sample S. The deflectors $D_1$, $D_2$ align the optic axis of the ion beam by being supplied with the voltage from the power supply $DS_1$ for these deflectors. The alignment of the optic axis of the ion beam by these deflectors $D_1$, $D_2$ is carried out when setting and adjustments are made prior to measurement. The ion beam is caused to converge by the accelerating electrode 5. Since the accelerating electrode 5 is configured as an Einzel-type lens, at this time the ion beam undergoes a converging action only and its velocity is not changed. A voltage i applied to the accelerating electrode 5 is applied by the electrode power supply $DS_2$. Furthermore, the ion beam is scanned by the beam deflectors $D_x$, $D_y$. The sample S placed at the position set as described above is subjected to two-dimensional measurement by virtue of the scanning operation. Control of the beam deflectors $D_x$, $D_y$ is performed by a voltage g applied by the beam-scanning power supply $DS_3$, and the voltage g is set by a control signal f from the scanning control circuit 75. The latter receives a signal from the control unit 74 and a timing signal from the gate circuit 63, and generates the control signal f. Control is exercised in such a manner that the voltage g is generated for the period of time during which the ion beam is directed toward the sample S but not for the period of time during which the ion beam is directed from the sample S toward the detector 4. Scanning of the ion beam is performed only for the period of time during which the ion beam is directed toward the sample S. The reason for this is that the output of the detector 4 would be affected if the ion beam were scanned while directed from the sample S to the detector 4.

The pulse generator 61 generates the pulse signal b and causes the trigger signal d to be applied to the time-to-pulse-height converter 72 via the trigger circuit 62. The control unit 74 applies the control signal to the electrode power supply $DS_2$, thereby controlling the voltage applied to accelerating electrode 5 to set the degree of convergence of the ion beam and the degree of acceleration of the charge particles.

When the sample S is irradiated with the ion pulses, particles are caused to scatter from the sample S. The scattered particles contain ions and neutral particles. The detector 4 detects those scattered particles which have scattered at a scattering angle of approximately 180°. The scattered ions and neutral particles pass the beam deflectors $D_x$, $D_y$ and the accelerating electrode 5 before arriving at the detector 4. As mentioned above, the beam deflectors $D_x$, $D_y$ do not operate while the ion beam is traveling from the sample S to the detector 4, and therefore the ion beam impinges upon the accelerating electrode 5 without being deflected by these beam deflectors. The accelerating electrode 5 is supplied with voltage from the electrode power supply DS$_2$ controlled by the control unit 74, as described above, and the ion beam undergoes convergence and selective acceleration. Selective acceleration involves accelerating the charged particles but not the neutral particles, namely the particles which carry no electric charge. The charged particles are accelerated to a velocity higher than that of the neutral particles, and therefore the charged particles pass the accelerating electrode 5 sooner than the neutral particles. Control of the applied voltage by the control unit 74 is determined by the extent of the beam converging effect and the size of the difference in the times at which the charged particles and neutral particles arrive at the detector 4 owing to the difference in velocities.

The charged particles arrive at the detector 4 sooner than the neutral particles. The detector 4 detects the arrival of the charged particles and neutral particles and produces a detection signal which is delivered to the amplifier 71. The detection signal is delivered via the signal lines $a_1, a_2, a_3, a_4$ shown in FIG. 5 or the signal lines $a_{11}-a_{18}, a_{21}-a_{28}, a_{31}-a_{38}, a_{41}-a_{48}$ shown in FIG. 6. The detection signals on the signal lines $a_1, a_2, a_3, a_4$ or $a_{11}-a_{18}, a_{21}-a_{28}, a_{31}-a_{38}, a_{41}-a_{48}$ are the signals from the anode plates $A_1, A_2, A_3, A_4$ or $A_{11}-A_{18}, A_{21}-A_{28}, A_{31}-A_{38}, A_{41}-A_{48}$ of the detector 4. In other words, these signals possess information relating to the scattering state, inclusive of information relating to the position of the sample S. The output of the amplifier 71 enters the time/pulse-height converter 72. The latter begins counting in response to the trigger signal d from the trigger circuit 62, as described above, and measures the time to arrival of the signal from the amplifier 71.

This counting operation is carried out for each of the anode plates $A_1, A_2, A_3, A_4$ or $A_{11}-A_{18}, A_{21}-A_{28}, A_{31}-A_{38}, A_{41}-A_{48}$. The counts indicating early arrival are indicative of charged particles, and those indicating late arrival are indicative of neutral particles. The output of the time-to-pulse height converter 72 enters the pulse-height analyzer 73, where the signal is subjected to an A/D conversion and the resulting digital values are accumulated in the form of a histogram in which time of flight T is plotted along the horizontal axis and the count of scattered ions that have been detected is plotted along the vertical axis. An arithmetic unit 78 reads in these items of data and subtracts time of flight $T_0$ (the value of which is already known) of the pulse of incident ions to the sample S from the time of flight T, whereby time of flight $T_1$ of scattered ions over the distance from the sample S to the detector 4 is obtained. The arithmetic unit 78 then calculates a time-of-flight spectrum (of the kind shown in FIG. 3) of the scattered ions with respect to time of flight $T_1$, and stores this spectrum in the memory 77. At the same time that the above-mentioned time-of-flight measurement is performed, the beam-scanning power supply DS3 is controlled by the control unit 74 whenever a pulse of incident ions is generated, thereby causing the pulse of incident ions to scan the sample S. In addition, the scanning position of the incident ions at the time of scanning is calculated and the time-of-flight spectrum of the scattered ions at each minute portion of the surface of sample S is recorded along with the scanning position of the incident ions. The position of the sample S relative to the incident ion beam also is stored in the memory 77 by the position control signal of the sample drive-unit control circuit 76 or a feedback signal from a position sensor. Accordingly, along with the information indicative of the position of the sample S relative to the incident ion beam and the information indicative of the scanning position of the incident ions, the memory 77 stores, for the position of each of the divided anode plates, a time-of-flight spectrum of the scattered ions at each minute portion of the surface of sample S. The contents of the memory 77 are displayed on the display unit 83 and recorded on the recorder 84.

Furthermore, the contents of the memory 77 are delivered to the arithmetic circuit 81, which analyzes the distribution of the composition of the sample surface and stores the analytical results in the memory 82. The contents of the memory 82 are displayed on the display unit 83 and recorded on the recorder 84. The output signals from the memories 77, 82 to the display unit 83 and recorder 84 are controlled by the control unit 85.

Before the next control signal c is applied, the sample drive unit control circuit 76 applies a control signal to the sample drive unit to change the position of the sample. After the position of the sample is changed, measurement is performed in the manner described above.

In accordance with the present invention, as described in detail above, the following advantages can be obtained:

(1) The ion beam can be made to converge on the surface of sample, thereby making possible micro-structural analysis of the sample surface.

(2) Ions and neutral particles can be measured while being distinguished from each other, and therefore the surface of the sample can be subjected to detailed analysis.

(3) Scattered ions over wide solid angle can be acquired owing to the converging action of the accelerating electrode. This makes it possible to raise ion detection efficiency.

(4) The distribution of scattering angles of the scattered ions can be measured by using divided anode plates.

The present invention can be practiced in various forms without departing from the spirit of the invention and the scope of the claims. Control may be performed in a consolidated manner by a control apparatus without providing the scanning control circuit and sample drive-unit control circuit of the above-described embodiment. In addition, the accelerating electrode of the second control electrode may be another type of electrode so long as it exhibits an action equivalent to that of an Einzel-type lens. Furthermore, it is obvious that the detector can be other than one using the microchannel plate of the foregoing embodiment. The manner in which the anode plate of the detector is divided may be changed in conformity with the mode of scattering, the detection characteristics and the like, the diameters of the concentric circles can be made different from those of the foregoing embodiment, and the angles of the arcs of the radiating plates need not be equal.

As many apparently widely different embodiments of the present invention can be made without departing from the spirit and scope thereof, it is to be understood that the invention is not limited to the specific embodiments thereof except as defined in the appended claims.

What is claimed is:

1. An ion-scattering spectrometer for irradiating a sample with an ion beam and detecting particles scattered from the sample as a result, comprising:

(a) a sample to be measured;

(b) an ion source for irradiating the sample with an ion beam;

(c) a first electrode for controlling irradiation of the sample with the ion beam;

(d) a detector disposed between the sample and said ion source on an axis connecting the sample and said ion source for detecting the scattered particles, said detector being disposed at such a distance from the sample that the scattered particles are capable of being classified by their respective times of flight;

(e) a second electrode disposed between the sample and said detector on the axis connecting the sample and said ion source for controlling ions scattered from the sample; and (f) a processing circuit for discriminating between charged particles and neutral particles and analyzing time of flight thereof based upon a detection signal from said detector.

2. The spectrometer according to claim 1, wherein said first electrode is chopping electrode.

3. The spectrometer according to claim 1, wherein said first electrode is chopping electrode and a deflecting electrode.

4. The spectrometer according to claim 1, wherein said second electrode is an Einzel-type lens.

5. The spectrometer according to claim 1, wherein said second electrode is an Einzel-type lens and a beam deflecting electrode.

6. The spectrometer according to claim 1, wherein an anode plate of said detector is divided into circular, concentric anode plates.

7. The spectrometer according to claim 6, wherein diameters of the divided circular, concentric anode plates have values proportional to tan $n\beta$, where $\beta$ represents scattering angle and n represents an integer.

8. The spectrometer according to claim 6, wherein said processing circuit has a memory, and said memory stores, along with position data indicative of the position of the sample relative to an incident ion beam and data indicative of a scanning position of incident ions, data indicative of a time-of-flight spectrum of the scattered ions at each minute portion of the surface of the sample, this data being stored for each position occupied by the divided anode plates.

9. The spectrometer according to claim 6, wherein said divided anode plates are further divided into equiangular arc-shaped anode plates.

10. The spectrometer according to claim 6, wherein said divided anode plates are divided into equiangular arc-shaped anode plates.

11. The spectrometer according to claim 10, wherein said processing circuit has a memory, and said memory stores, along with position data indicative of the position of the sample relative to an incident ion beam and data indicative of a scanning position of incident ions, data indicative of a time-of-flight spectrum of the scattered ions at each minute portion of the surface of the sample, this data being stored for each position occupied by the divided anode plates.

12. The spectroscope according to claim 8 or 10, wherein data stored in said memory is outputted to a display unit or recorder as is or in the form of data obtained by analyzing a composition distribution of the surface of the sample.

13. The spectroscope according to claim 1, wherein said processing circuit includes a time-to-pulse-height converter, a pulse-height analyzer, and an arithmetic circuit for calculating, from data outputted by said pulse-height analyzer, a time-of-flight spectrum of the scattered ions.

* * * * *